(12) United States Patent
Greenberg

(10) Patent No.: US 8,090,010 B2
(45) Date of Patent: *Jan. 3, 2012

(54) ALL DIGITAL IMPLEMENTATION OF CLOCK SPECTRUM SPREADING (DITHER) FOR LOW POWER/DIE AREA

(75) Inventor: Jody Greenberg, Sunnyvale, CA (US)

(73) Assignee: Marvell World Trade Ltd. (BB)

(*) Notice: Subject to any disclaimer, the term of this patent is extended or adjusted under 35 U.S.C. 154(b) by 0 days.

This patent is subject to a terminal disclaimer.

(21) Appl. No.: 11/803,100

(22) Filed: May 11, 2007

(65) Prior Publication Data

US 2007/0211819 A1  Sep. 13, 2007

Related U.S. Application Data

(63) Continuation of application No. 11/246,328, filed on Oct. 6, 2005, now Pat. No. 7,221,704.

(60) Provisional application No. 60/704,510, filed on Aug. 1, 2005, provisional application No. 60/722,731, filed on Sep. 30, 2005.

(51) Int. Cl.
*H04B 17/00* (2006.01)
*H04Q 1/20* (2006.01)

(52) U.S. Cl. ........ 375/226; 375/225; 375/227; 375/371; 375/373; 375/376

(58) Field of Classification Search .......... 375/226, 375/225, 227, 228, 130, 135, 133, 132, 146, 375/359; 331/17; 370/516, 474
See application file for complete search history.

(56) References Cited

U.S. PATENT DOCUMENTS

| 4,503,405 A * | 3/1985 | Jordan et al. ............ 332/123 |
| 4,926,447 A * | 5/1990 | Corsetto et al. .......... 375/376 |
| 5,909,144 A | 6/1999 | Puckette et al. |
| 5,920,555 A | 7/1999 | Hulbert |
| 6,044,124 A | 3/2000 | Monahan et al. |
| 6,160,861 A * | 12/2000 | McCollough ............ 375/376 |
| 6,353,649 B1 * | 3/2002 | Bockleman et al. ..... 375/376 |

(Continued)

FOREIGN PATENT DOCUMENTS

EP   0 478 264 A1   4/1992

(Continued)

OTHER PUBLICATIONS

European Search Report for Application No. 06015918.3 dated Oct. 28, 2011.

*Primary Examiner* — Khanh C Tran
*Assistant Examiner* — Qutbuddin Ghulamali

(57) ABSTRACT

A digital circuit configured to spread a clock train spectrum includes a clock configured to generate the clock train, and a variable divider configured to divide the frequency of the clock train by a temporally-varying-divider value to modulate the clock train and generate a dithered clock train. The circuit further includes a first accumulator configured to accumulate the dithered clock train to generate a frequency modulation waveform, and a second accumulator configured accumulate the frequency modulated waveform to generate a phase modulation signal. The circuit further includes a phase-value calculator configured to calculate the temporally-varying divider value based on the phase modulation signal; and a closed-loop control circuit configured to track and filter the modulation of the dithered clock train to generate a second clock train that is the spread spectrum of the first mentioned clock train.

38 Claims, 7 Drawing Sheets

U.S. PATENT DOCUMENTS

| | | | |
|---|---|---|---|
| 6,650,719 | B1 | 11/2003 | Baker |
| 7,006,589 | B2 | 2/2006 | Staszewski et al. |
| 7,042,970 | B1* | 5/2006 | Keaveney et al. .............. 375/371 |
| 7,181,180 | B1* | 2/2007 | Teo et al. ...................... 455/260 |
| 2002/0090917 | A1* | 7/2002 | Hirano et al. ................... 455/76 |
| 2002/0094015 | A1* | 7/2002 | Harles et al. ................... 375/130 |
| 2002/0094053 | A1* | 7/2002 | Blazo ............................ 375/376 |
| 2003/0174799 | A1* | 9/2003 | Fahim ........................... 375/376 |
| 2003/0223480 | A1* | 12/2003 | Cafarella ....................... 375/219 |
| 2004/0161047 | A1 | 8/2004 | Liu et al. |
| 2005/0041766 | A1* | 2/2005 | Thompson ..................... 375/376 |
| 2005/0077935 | A1* | 4/2005 | Giuroiu ......................... 327/156 |
| 2005/0078734 | A1* | 4/2005 | Baker et al. ................... 375/130 |
| 2005/0286670 | A1 | 12/2005 | Jungerman |
| 2006/0056491 | A1* | 3/2006 | Lim et al. ...................... 375/130 |
| 2006/0133517 | A1* | 6/2006 | Ko ................................ 375/247 |
| 2006/0141966 | A1* | 6/2006 | Ko ................................ 455/260 |
| 2006/0233291 | A1 | 10/2006 | Garlepp et al. |
| 2007/0019711 | A1* | 1/2007 | Mallinson et al. ............. 375/130 |
| 2007/0189417 | A1* | 8/2007 | Waheed et al. ................ 375/300 |
| 2007/0189431 | A1* | 8/2007 | Waheed et al. ................ 375/376 |
| 2008/0008285 | A1* | 1/2008 | Smith et al. ................... 375/376 |

FOREIGN PATENT DOCUMENTS

EP  1 133 056 A2  9/2001

* cited by examiner

US 8,090,010 B2

ALL DIGITAL IMPLEMENTATION OF CLOCK SPECTRUM SPREADING (DITHER) FOR LOW POWER/DIE AREA

RELATED APPLICATIONS

This application is a continuation of U.S. application Ser. No. 11/246,328, filed Oct. 6, 2005, now U.S. Pat. No. 7,221,704 which claims the benefit of U.S. Provisional Application No. 60/704,510, filed Aug. 1, 2005, and U.S. Provisional Application No. 60/722,731, filed Sep. 30, 2005, all of which are incorporated by reference.

BACKGROUND OF THE INVENTION

The present invention generally relates to integrated circuits, and more particularly relates to digitally spreading a clock spectrum in digital circuits.

The spreading of a clock spectrum generally includes spreading the power of clock pulses over a range of frequencies. FIG. 1 is a simplified schematic of a first clock train 100 and a spread-spectrum clock train 105. The pulses in spread-spectrum clock train 105 are spread-spectrum pulses that may be generated from the clock pulses in the first clock train 100. The clock edges of the spread-spectrum pulses move in and out as indicated by the arrows in FIG. 1. A spread-spectrum clock train is typically generated for applications in which jitter sensitivity is generally low and/or in which lowering peak power of clock pulses is desired.

Traditional circuits configured to spread the spectrum of a clock train often include both digital and analog circuits, which typically include a digital modulator and an analog phase interpolator. The digital modulator is configured to receive a clock train (e.g., the first clock train) from a clock generator. The clock train may be a digital clock train. The digital modulator may be configured to modulate the clock train using a dithering waveform to generate a dithered waveform. The dithered waveform may then be transferred to the analog-phase interpolator that is configured to phase interpolate the dithered waveform. Based on the phase interpolation of the dithered waveform, the analog-phase interpolator is configured to generate and output a spread-spectrum clock train.

These traditional circuits configured to spread the spectrum of a clock train have a number of inherent shortcomings especially for low power circuit applications. For example, typical digital modulators configured to modulate a clock train typically operate at the clock frequency of the clock train, which is typically the relatively high frequency of a free running clock (e.g., generated by a crystal oscillator). As traditional digital modulators are configured to operate at a free running clock frequency, these digital modulators tend to draw relatively high current.

Not only do the digital modulators included in these traditional circuits typically draw relatively high current, the analog-phase interpolators in these traditional circuits also typically draw relatively high current. For example, an analog-phase interpolator may draw as much as a digital modulator. Moreover, as these traditional circuits typically include analog devices (namely, an analog-phase interpolator), the shape of the spread-spectrum clock pulses and the amount of power reduction of these clock pulses is generally limited by the linearity of the analog-phase interpolator. Analog-phase interpolators having relatively high linearly are relatively costly to design and manufacture, and are relatively large. Also, as these traditional circuits often include both digital circuits and analog circuits, these traditional circuits tend to take up relatively large amounts of die space, which tends to make these circuits relatively costly to manufacture.

Therefore, new circuits are needed that are configured to spread the spectrum of a clock train, that draw relatively less current than traditional circuits that are configured to provide this function, and that take up relatively less die area than traditional circuits.

BRIEF SUMMARY

Accordingly, embodiments of the present invention provide circuits, methods, apparatus, code for controlling circuits, code, and/or means to condition a clock train, and specifically to spread the spectrum of the clock train.

According to an exemplary embodiment of the present invention, code configured to spread the spectrum of a clock train includes code for generating the clock train, and code for dividing the frequency of the clock train by a temporally-varying-divider value to modulate the clock train and generate a dithered clock train. The exemplary embodiment further includes code for accumulating the dithered clock train to generate a frequency modulation waveform; and code for accumulating the frequency modulated waveform to generate a phase modulation signal. The exemplary embodiment further includes code for calculating the temporally-varying divider value based on the phase modulation signal; and code for tracking and filtering the modulation of the dithered clock train to generate a second clock train.

According to a specific embodiment of the code, the first clock train is a digital clock train. The temporally-varying divider value is a fixed-divider value plus a phase value. The phase value is determined from the frequency modulation waveforn. The phase value is proportional to the deviation of the frequency modulation waveform from the center of the frequency modulation waveform. The frequency modulation waveform is periodic or quasi-periodic. The frequency modulation waveform is a triangle waveform. The closed-loop control circuit is configured to multiply the frequency of the dithered clock train by a fixed-multiplier value. The temporally-varying divider value is a fixed-divider value plus a phase value, and the average frequency of the second clock train is the frequency of the first clock train multiplied by the fixed-multiplier value and divided by the fixed-divider value. The exemplary embodiment further includes code for calculating the difference between a first portion of the phase modulation signal and a second portion of the phase modulation signal, wherein the second portion is temporally retarded with respect to the first portion; and the difference is the phase value. The exemplary embodiment further includes code for adding the phase value to a fixed divider value to generate the temporally-varying-divider value.

Another exemplary embodiment of the present invention includes means for spreading the spectrum of a clock train, and more specifically includes clock generating means for generating the clock train, and a variable divider means for receiving the clock train from the clock generator mean and dividing the frequency of the clock train by a temporally-varying-divider value to modulate the clock train and generate a dithered clock train. The exemplary embodiment further includes first accumulator means for receiving the dithered clock train from the variable divider means and accumulating the dithered clock train to generate a frequency modulation waveform. The exemplary embodiment further includes second accumulator means for receiving the frequency modulation waveform from the first accumulator means and accumulating the frequency modulated waveform to generate a phase modulation signal. The exemplary embodiment further includes phase-value calculator means for receiving the phase modulation signal from the second accumulator means and calculating the temporally-varying divider value based on the phase modulation signal. The exemplary embodiment further includes closed-loop control means for receiving the dithered clock train from the variable divider means and tracking and filtering the modulation of the dithered clock train to generate a second clock train that is the spread spectrum of the first mentioned clock train.

According to a specific embodiment of the clock spreading means, the first clock train is a digital clock train. The temporally-varying divider value is a fixed-divider value plus a phase value. The phase value is determined from the frequency modulation waveform. The phase value is proportional to the deviation of the frequency modulation waveform from the center of the frequency modulation waveform. The frequency modulation waveform is periodic or quasi-periodic. The frequency modulation waveform is a triangle waveform. The clock pulses of the second clock train have larger temporal widths than the clock pulses of the first clock train. The closed-loop control means is configured for multiplying the frequency of the dithered clock train by a fixed-multiplier value. The temporally-varying divider value is a fixed-divider value plus a phase value, and the average frequency of the second clock train is the frequency of the first clock train multiplied by the fixed-multiplier value and divided by the fixed-divider value. The exemplary embodiment further includes means for calculating the difference between a first portion of the phase modulation signal and a second portion of the phase modulation signal, wherein the second portion is temporally retarded with respect to the first portion; and the difference is the phase value. The exemplary embodiment further includes means for adding the phase value to a fixed divider value to generate the temporally-varying-divider value.

Another exemplary embodiment of the present invention includes code for spreading a clock spectrum, and more specifically includes code for generating a phase value based on a frequency modulation waveform; and code for dividing a frequency of the clock train by a divider value that includes a fixed value plus the phase value to generate a dithered clock train that is phase modulated by the phase value. The exemplary embodiment further includes code for accumulating the dithered clock train to generate the frequency modulation waveform; and code for accumulating the frequency modulation waveform to generate a phase modulation signal and generate the phase value based on the phase modulation signal. The exemplary embodiment further includes code for tracking and locking onto the modulation of the dithered clock train; and based on the tracking and locking steps, code for generating a spread-spectrum clock train that is the spread spectrum of the clock train. The frequency modulation waveform is periodic or quasi periodic. The frequency modulation waveform is a triangle waveform. The frequency modulation waveform is a digital signal. The clock train is a digital clock train. The dithered clock train is a digital clock train. The phase value is proportional to the deviation of the frequency modulation waveform from the center of the frequency modulation waveform. The exemplary embodiment further includes code for multiplying the frequency of the dithered clock train by a multiplier value. The average frequency of the spread-spectrum clock train is the frequency of the clock train multiplied by the multiplier value divided by the fixed value. The exemplary embodiment further includes code for splitting the phase modulation signal into a first phase modulation signal and a second phase modulation signal; code for temporally delaying the second phase modulation signal with respect to the first phase modulation signal; and code for thereafter calculating the different between the first phase modulation signal and the second phase modulation signal to generate the phase value. The exemplary embodiment further includes code for adding the phase value to the fixed value to generate the divider value.

Another exemplary embodiment of the present invention includes means for spreading a clock spectrum, and more specifically includes means for generating a phase value based on a frequency modulation waveform; and means for dividing a frequency of the clock train by a divider value that includes a fixed value plus the phase value to generate a dithered clock train that is phase modulated by the phase value. The exemplary embodiment further includes means for accumulating the dithered clock train to generate the frequency modulation waveform; and means for accumulating the frequency modulation waveform to generate a phase modulation signal and generate the phase value based on the phase modulation signal. The exemplary embodiment further includes means for tracking and locking onto the modulation of the dithered clock train. The exemplary embodiment further includes means for generating a spread-spectrum clock train that is the spread spectrum of the clock train based on tracking the modulation of the dithered clock train and filtering the dithered clock train. The frequency modulation waveform is periodic or quasi periodic. The frequency modulation waveform is a triangle waveform. The frequency modulation waveform is a digital signal. The clock train is a digital clock train. The dithered clock train is a digital clock train. The phase value is proportional to the deviation of the frequency modulation waveform from the center of the frequency modulation waveform. The exemplary embodiment further includes means for multiplying the frequency of the dithered clock train by a multiplier value. The average frequency of the spread-spectrum clock train is the frequency of the clock train multiplied by the multiplier value divided by the fixed value. The exemplary embodiment further includes means for splitting the phase modulation signal into a first phase modulation signal and a second phase modulation signal; means for temporally delaying the second phase modulation signal with respect to the first phase modulation signal; and means for thereafter calculating the different between the first phase modulation signal and the second phase modulation signal to generate the phase value. The exemplary embodiment further includes means for adding the phase value to the fixed value to generate the divider value.

Another exemplary embodiment of the present invention includes code for spreading the spectrum of a clock train, and more specifically includes code for generating a dithered clock train, and code for accumulating the dithered clock train to generate a frequency modulation waveform. The exemplary embodiment further includes code for accumulating the frequency modulation waveform to generate a phase modulation signal; and code for generating a temporally-varying divider value based on the phase modulation signal. The exemplary embodiment further includes code for digitally modulating the width based on the temporally-varying divider value. The exemplary embodiment further include code for tracking the modulation of the dithered clock train and filtering the dithered clock train to generate a second clock train that is the spread spectrum of the first mentioned clock train. The temporally-varying divider value is a fixed-divider value plus a phase value. The exemplary embodiment further includes code for generating the phase value based on the phase modulation signal. The exemplary embodiment further includes code for splitting the phase modulation signal into first and second phase modulation signals; and code for delaying the second phase modulation signal with respect to the first modulation signal to thereafter calculate the difference between first phase modulation signal and the second phase modulation signal to generate the phase value. The exemplary embodiment further includes code for adding the phase value to the fixed-divider value. The phase value is proportional to the deviation of the digital-frequency modulation waveform from the center of the digital-frequency modulation waveform. The frequency modulation waveform is a periodic or quasi-periodic. The frequency modulation waveform is a triangle waveform.

Another exemplary embodiment of the present invention includes means for spreading the spectrum of a clock train, and more specifically includes means for generating a dithered clock train, and means for accumulating the dithered clock train to generate a frequency modulation waveforn. The exemplary embodiment further includes means for accumulating the frequency modulation waveform to generate a phase modulation signal; and means for generating a temporally-varying divider value based on the phase modulation signal. The exemplary embodiment further includes means for digitally modulating the clock train based on the temporally-varying divider value. The exemplary embodiment further include means for tracking the modulation of the dithered clock train and filtering the dithered clock train to generate a second clock train that is the spread spectrum of the first mentioned clock train. The temporally-varying divider value is a fixed-divider value plus a phase value. The exemplary embodiment further includes means for generating the phase value based on the phase modulation signal. The exemplary embodiment further includes means for splitting the phase modulation signal into first and second phase modulation signals; and means for delaying the second phase modulation signal with respect to the first modulation signal to thereafter calculate the difference between first phase modulation signal and the second phase modulation signal to generate the phase value. The exemplary embodiment further includes means for adding the phase value to the fixed-divider value. The phase value is proportional to the deviation of the digital-frequency modulation waveform from the center of the digital-frequency modulation waveform. The frequency modulation waveform is a periodic or quasi-periodic. The frequency modulation waveform is a triangle waveform.

A better understanding of the nature and advantages of the present invention may be gained with reference to the following detailed description and the accompanying drawings.

DETAILED DESCRIPTION OF THE EXEMPLARY EMBODIMENTS

The present invention generally provides a digital circuit apparatus and digital circuit method for conditioning a digital signal. More specifically, the present invention provides a digital circuit apparatus and digital circuit method for spreading a clock spectrum.

Figure 1:
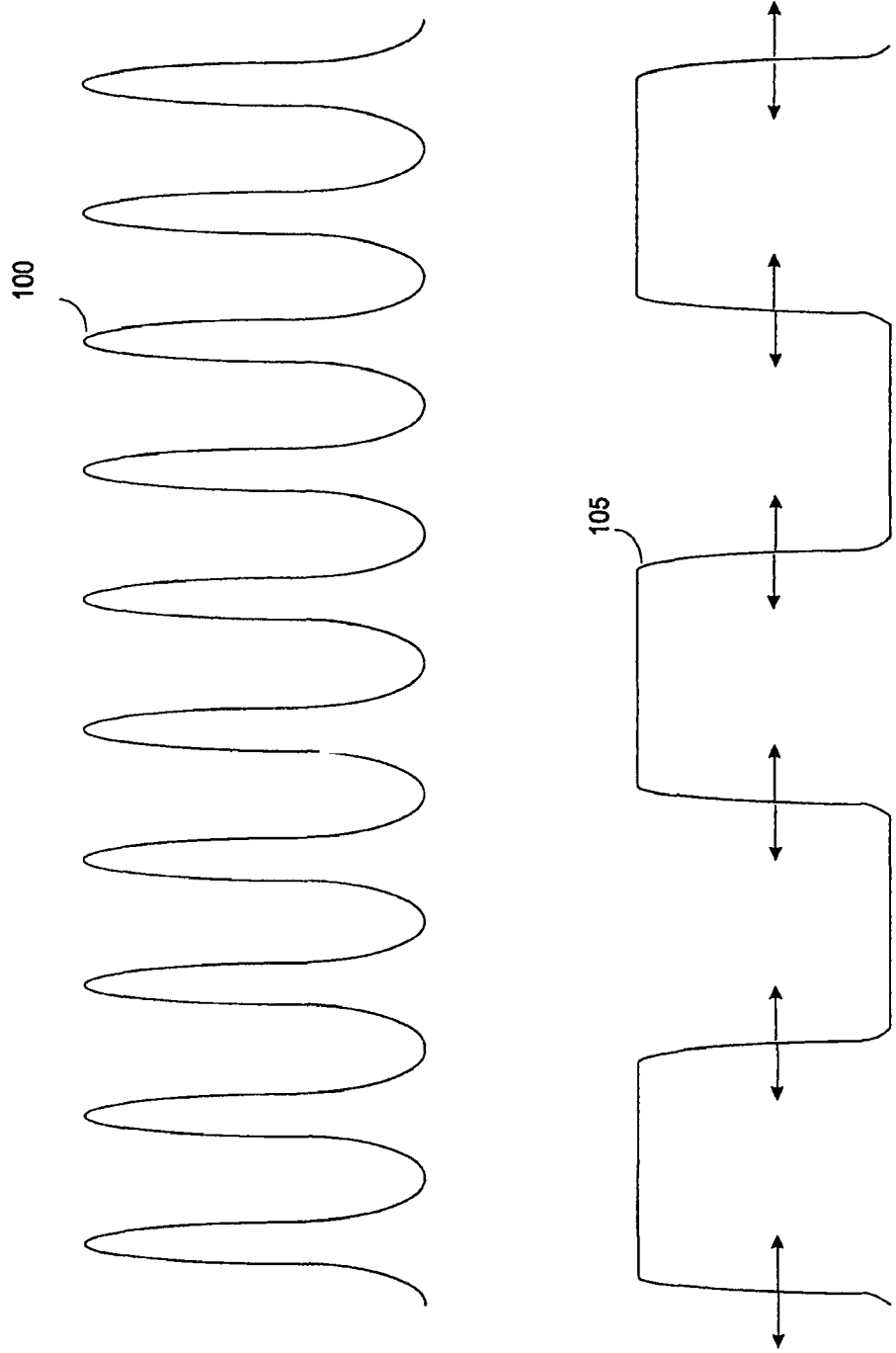
FIG. 1 is a simplified schematic of a first clock train and a spread-spectrum clock train that may be generated from the first clock train according to one embodiment of the present invention.

Spreading a clock spectrum, such as a digital clock spectrum, includes spreading the power of clock pulses over a range of frequencies. FIG. 1 is a simplified schematic of a first clock train 100 and a spread-spectrum clock train 105 that may be generated from the first clock train according to an embodiment of the present invention. The edges of the spread-spectrum clock train are dithered with respect to the first clock train as indicated by the arrows in FIG. 1. The clock pulses of the first clock train may be digitally conditioned to generate the spread spectrum clock pulses in the spread-spectrum clock train.

Figure 2:
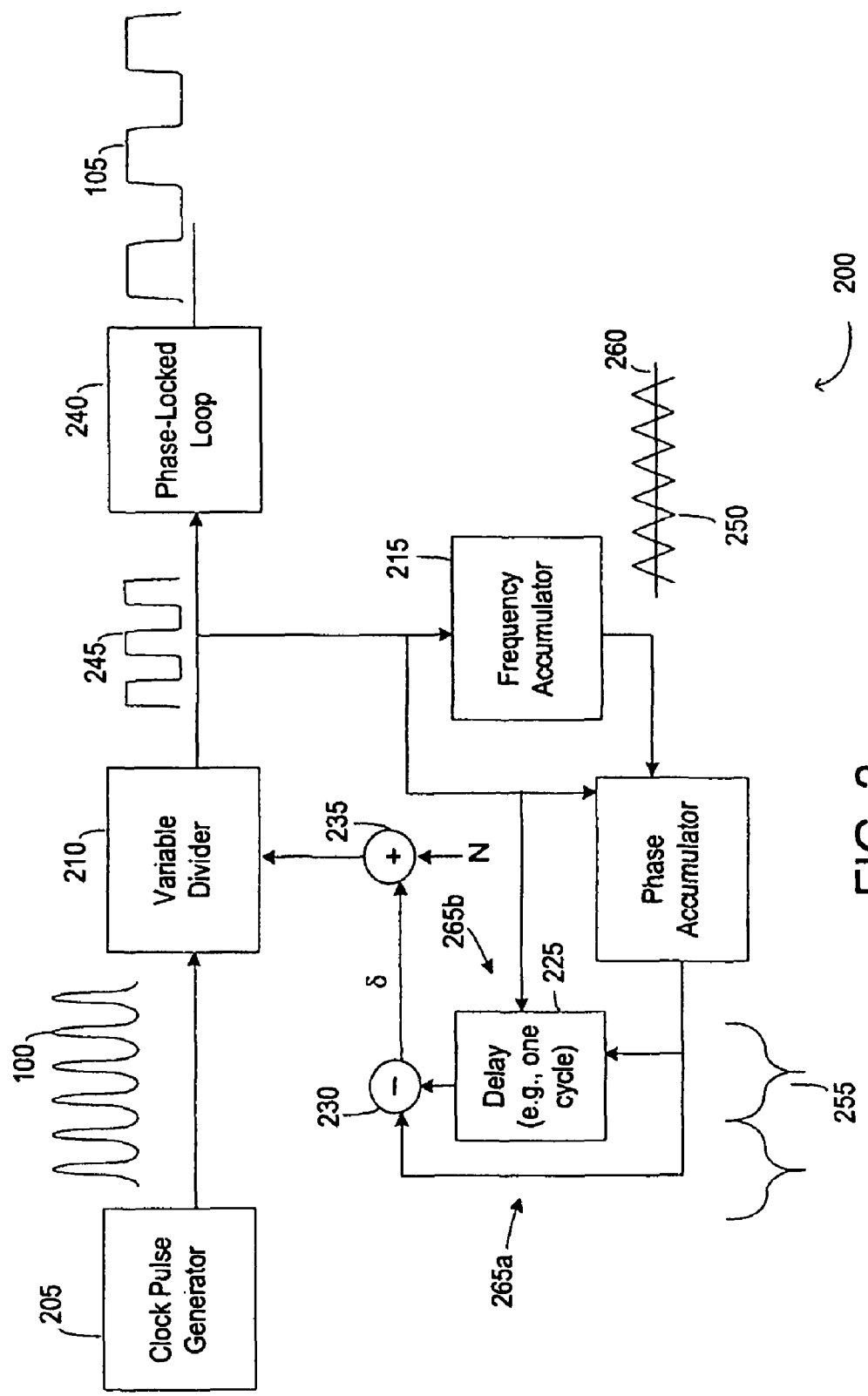
FIG. 2 is a simplified schematic of a digital circuit configured to generate a spread-spectrum clock train according to one embodiment of the present invention.

FIG. 2 is a simplified schematic of a circuit 200 according to one embodiment of the present invention. Circuit 200 includes a clock pulse generator 205, a variable divider 210, a first accumulator 215, a second accumulator 220, a delay circuit 225, and first adder 230, a second adder 235, and a phase-locked loop (PLL) 240. Delay circuit 225, adder 230, and adder 235 are sometimes referred to herein as the phase-value calculator. According to one embodiment, each of the forgoing listed circuits is a digital circuit. According to an alternative embodiment, the PLL may be a mixed signal circuit. Circuit 200 is configured to generate the first clock train 100, and condition the first clock train to generate the spread-spectrum clock train 105. The frequency "f1" of the first clock train may be the oscillation frequency of a free running clock, such as a crystal oscillator. The average frequency "f2" of the spread-spectrum clock train can be less than, equal to, or greater than to f1.

According to one embodiment, clock pulse generator 205 is configured to generate the first clock train 100, which may be a digital clock train. The first clock train is transferred from an output of clock pulse generator 205 to an input of variable divider 210. Variable divider 210 is configured to generate a dithered clock train 245 that has a frequency "f3." More specifically, the variable divider is configured to divide the frequency f1 of the clock train by a "divider" value N+δ, wherein f3 is equal to f1/(N+δ). N may be a fixed value (e.g., 128) and δ may be a time varying value (referred to herein as a phase value). Generation of the phase value is described in detail below. The phase value may be relatively small compared to the N. For example, the absolute value of δ may be 10 times less than N, or smaller (e.g., 20 times less than N). The value of N may be user specified or may be specified by other circuits (not shown) that are coupled to circuit 200. The value of N may be specified according to a particular application for which circuit 200 is intended.

Dithered clock train 245 may be transferred from an output of the variable divider to an input of accumulator 215 and to an input of PLL 240. Accumulator 215 (sometimes referred to herein as a frequency accumulator) is configured to accumulate the dithered clock train, and therefrom, generate a frequency modulation waveform 250, which may be a digital signal. The frequency modulation waveform may be periodic or quasi periodic and may have a variety of shapes, such as triangular, saw-toothed, teardrop, capricious or the like. The frequency modulation waveform is used by circuit 200 to modulate the phase of clock train 100 to generate the dithered clock train having dithered edges. Specifically, the frequency modulation waveform is transferred from an output of accumulator 215 to an input of accumulator 220 (sometimes referred to herein as the phase accumulator). Accumulator 220 is configured to accumulate the frequency modulation waveform and is configured to receive the dithered clock train from the variable divider. Accumulator 220 is further configured to generate a phase modulation signal 255 from the accumulated frequency modulation waveform.

According to one embodiment, the phase value is proportional to the deviation of the frequency modulation waveform from the center of the frequency modulation waveform. For example, if the frequency modulation waveform is a triangle waveform, the phase value may be proportional to a value of the triangle waveform above or below a reference line 260. More specifically, to calculate the phase value, the phase modulation signal is transferred via two circuit paths 265a and 265b to adder 230. Circuit path 265a might be a non-delayed path. Circuit path 265b may include delay circuit 225 that is configured to delay the phase modulation signal in the second circuit path relative to the phase modulation signal in the first circuit path. Delay circuit 225 may delay the phase modulation signal in circuit path 265b based on the received dithered clock 245. Adder 230 is configured to subtract the delayed phase modulation signal from the phase modulation signal that is not delayed. Stated alternatively, adder 230 is configured to calculate the difference in the phase modulation signal at different "time points." The calculated difference in the phase modulation signal at different time points is the phase value δ. The phase value δ is transferred from adder 230 to adder 235, which is configured to add the phase value to the fixed value N to generate the divider value N+δ. δ may be negative or positive depending, for example, on the amount the phase modulation signal is delayed by the delay circuit.

As the frequency modulation waveform changes with time, so too does the phase value. For example, as the frequency modulation waveform rises, the phase value similarly rises, and as the frequency modulation waveform decreases, the phase value similarly decreases. The phase value may decrease from a positive value to a negative value as the phase modulation waveform changes. Further, as the phase value changes with time, so too does the divider value N+δ. Further yet, as the divider value temporally changes, the variable divider divides the frequency f1 of the first clock train by these temporally changing divider values. For example, as the divider values increase, the edges of the dithered clock train generated by the variable divider extend (i.e., the frequency of the dithered clock train decreases), and as the divider values decrease, the edges of the dithered clock train retract (i.e., the frequency of the dithered clock train increases). This phase change of the dithered clock train changes at approximately the frequency of the frequency modulation waveform.

According to one embodiment, the frequency of the phase change of the dithered clock train is within the operable detection range of PLL 240. Accordingly, the PLL can track and lock onto the modulation of the dithered clock train to filter the dithered clock train to generate the spread-spectrum clock train. As the edges (i.e., phase) of the dithered clock train dither, the edges of the clock pulses of the spread-spectrum clock train similarly dither.

According to one embodiment, the PLL may be configured to multiply the frequency of the dithered clock train by a multiplier value "M," such that the average frequency f2 of spread-spectrum clock train 105 is (M/N)·f1. The value of M may be adjusted to tune the frequency f2 to a variety of desired values.

Figure 3:
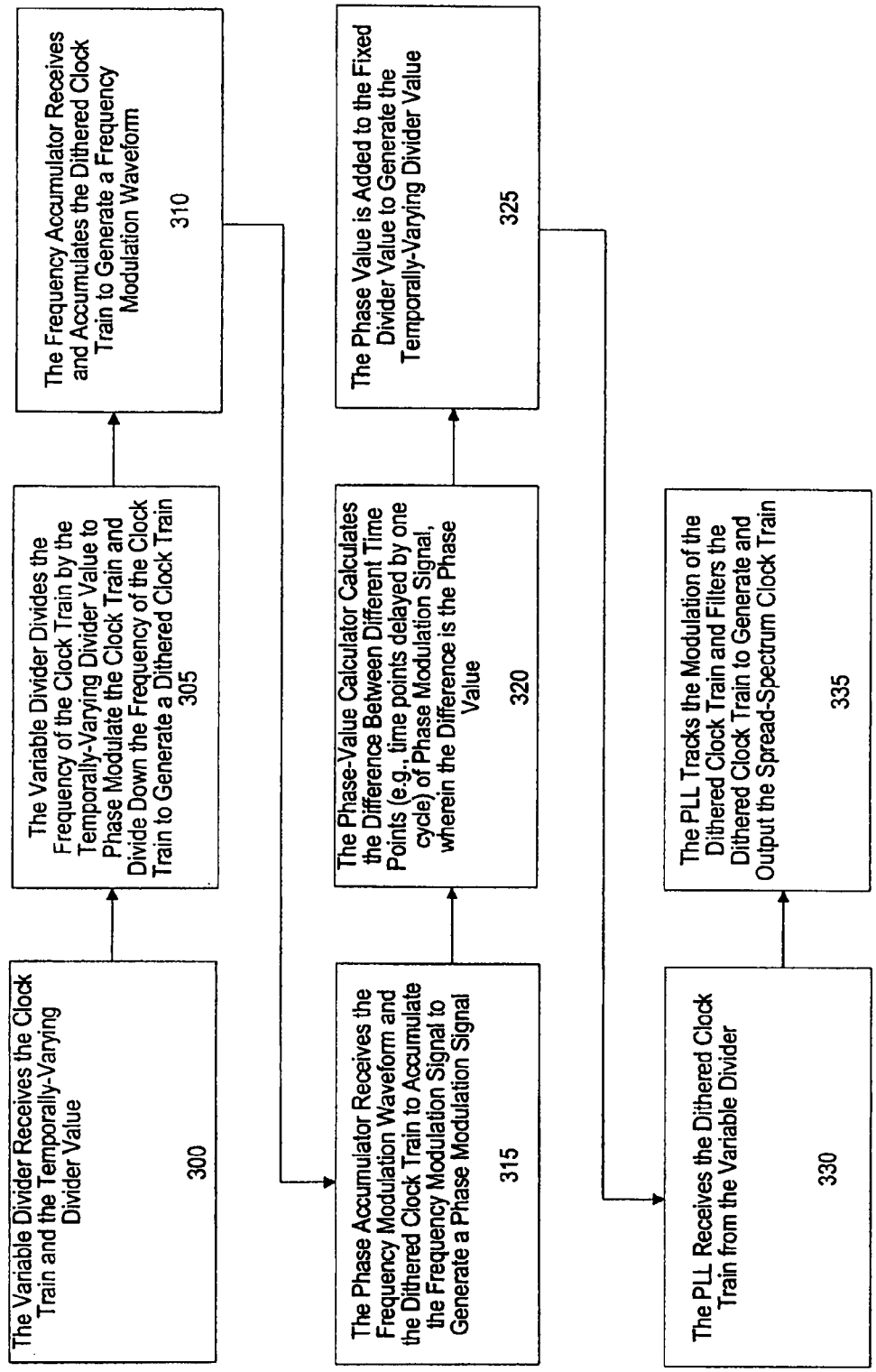
FIG. 3 is a high-level flow chart having steps for generating a spread-spectrum clock train according to one embodiment of the present invention.

FIG. 3 is a high-level flow chart having steps for spreading the spectrum of clock pulses composing clock train 100 to generate spread-spectrum clock train 105. It should be understood that the steps of the described high-level flow are exemplary and that various steps may be substituted with alternative steps, steps may be combined, and/or steps may be eliminated without deviation from the embodiment represented by the high-level flow chart. In an initial step 300, the variable divider receives the clock train and the temporally-varying divider value. In a step 305, the variable divider divides the frequency of the clock train by the temporally-varying divider value to phase modulate the clock train and thereby generate the dithered clock train. The temporally-varying divider value includes the fixed value plus the phase value, which temporally varies. In a step 310, the frequency accumulator receives the dithered clock train from the variable divider, and generates the frequency modulation waveform based on accumulation of the dithered clock train. In a step 315, the phase accumulator receives the frequency modulation waveform from the frequency accumulator and generates the phase modulation signal based on accumulation of the frequency modulation waveform. In a step 320, the phase-value calculator calculates the difference between different time points of the phase modulation signal; the difference is the phase value. In a step 325, the phase value is added to the fixed value to generate the temporally-varying divider value. In a step 330, a phase-locked loop (PLL) receives the dithered clock train from the variable divider. In a step 335, the PLL tracks the modulation of the dithered clock train and filters the dithered clock train to generate and output the spread-spectrum clock train.

Figure 4B:
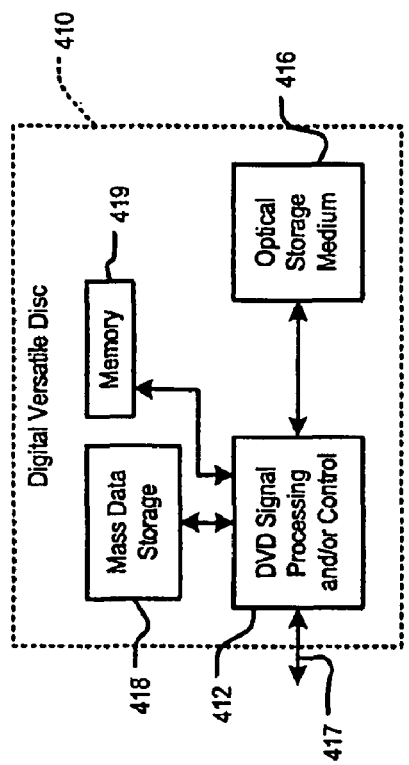
FIGS. 4A-4H illustrate various implementations of exemplary embodiments of the present invention.
Figure 4A:
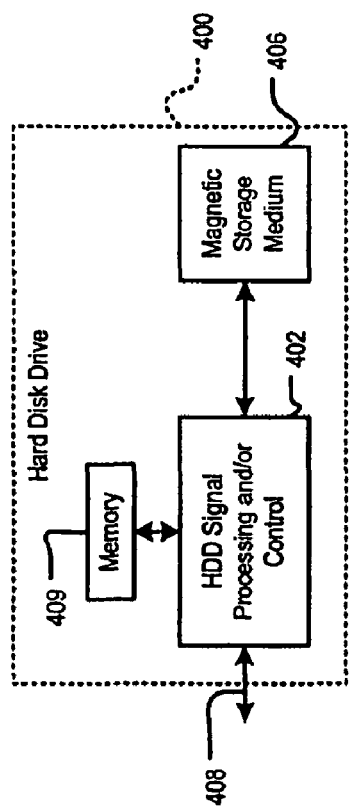

Referring now to FIGS. 4A-4G, various exemplary implementations of the present invention are shown. Referring to FIG. 4A, the present invention may be embodied in a hard disk drive 400. The present invention may implement either or both signal processing and/or control circuits, which are generally identified in FIG. 4A at 402. In some implementations, signal processing and/or control circuit 402 and/or other circuits (not shown) in HDD 400 may process data, perform coding and/or encryption, perform calculations, and/or format data that is output to and/or received from a magnetic storage medium 406.

HDD 400 may communicate with a host device (not shown) such as a computer, mobile computing devices such as personal digital assistants, cellular phones, media or MP3 players and the like, and/or other devices via one or more wired or wireless communication links 408. HDD 400 may be connected to memory 409, such as random access memory (RAM), a low latency nonvolatile memory such as flash memory, read only memory (ROM) and/or other suitable electronic data storage.

Referring now to FIG. 4B, the present invention may be embodied in a digital versatile disc (DVD) drive 410. The present invention may implement either or both signal processing and/or control circuits, which are generally identified in FIG. 4B at 412, and/or mass data storage 418 of DVD drive 410. Signal processing and/or control circuit 412 and/or other circuits (not shown) in DVD 410 may process data, perform coding and/or encryption, perform calculations, and/or format data that is read from and/or data written to an optical storage medium 416. In some implementations, signal processing and/or control circuit 412 and/or other circuits (not shown) in DVD 410 can also perform other functions such as encoding and/or decoding and/or any other signal processing functions associated with a DVD drive.

DVD drive 410 may communicate with an output device (not shown) such as a computer, television or other device via one or more wired or wireless communication links 417. DVD 410 may communicate with mass data storage 418 that stores data in a nonvolatile manner. Mass data storage 418 may include a hard disk drive (HDD) such as that shown in FIG. 4A. The HDD may be a mini HDD that includes one or more platters having a diameter that is smaller than approximately 1.8". DVD 410 may be connected to memory 419, such as RAM, ROM, low latency nonvolatile memory such as flash memory, and/or other suitable electronic data storage.

Figure 4D:
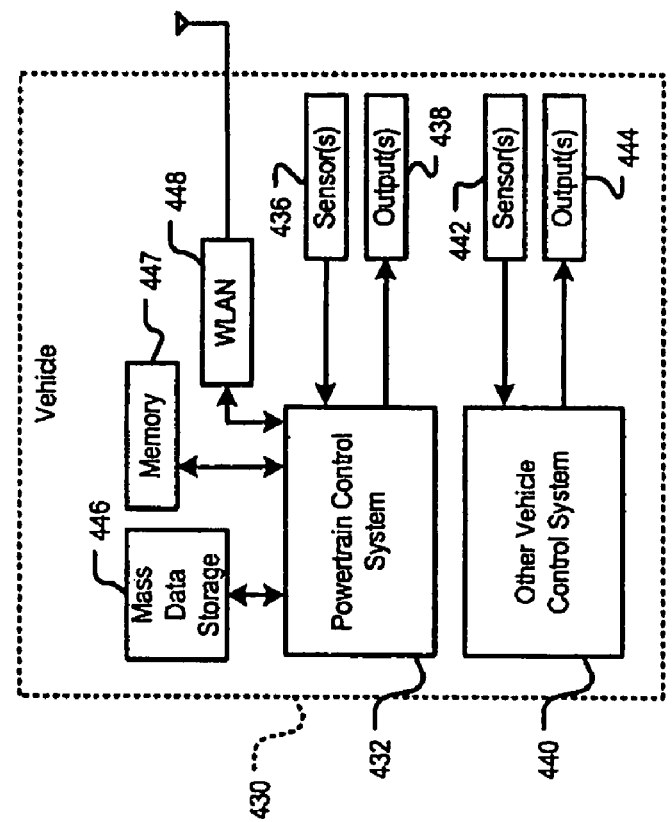
Figure 4C:
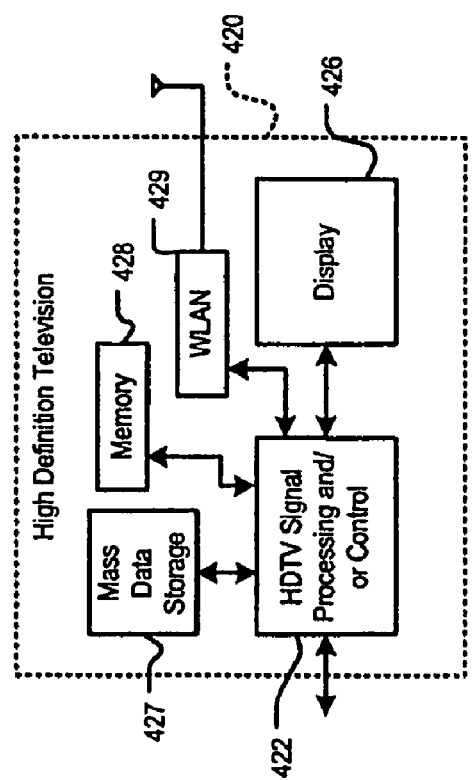

Referring now to FIG. 4C, the present invention may be embodied in a high definition television (HDTV) 420. The present invention may implement either or both signal processing and/or control circuits, which are generally identified in FIG. 4C at 422, a WLAN interface and/or mass data storage of the HDTV 420. HDTV 420 receives HDTV input signals in either a wired or wireless format and generates HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. At least one HDD may have the configuration shown in FIG. 4A and/or at least one DVD may have the configuration shown in FIG. 4B. The HDD may be a mini HDD that includes one or more platters having a diameter that is smaller than approximately 1.8". HDTV 420 may be connected to memory 428 such as RAM, ROM, low latency nonvolatile memory such as flash memory and/or other suitable electronic data storage. HDTV 420 also may support connections with a WLAN via a WLAN network interface 429.

Referring now to FIG. 4D, the present invention implements a control system of a vehicle 430, a WLAN interface and/or mass data storage of the vehicle control system. In some implementations, the present invention implements a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 440 of vehicle 430. Control system 440 may likewise receive signals from input sensors 442 and/or output control signals to one or more output devices 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown).

Figure 4E:
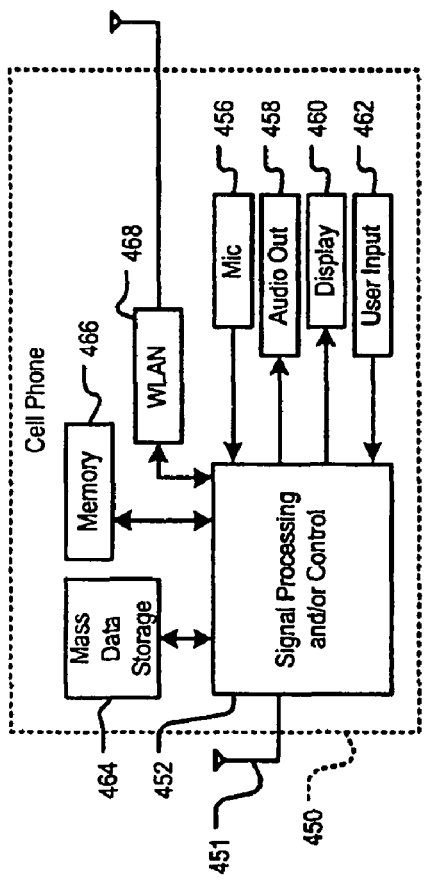

Referring now to FIG. 4E, the present invention may be embodied in a cellular phone 450 that may include a cellular antenna 451. The present invention may implement either or both signal processing and/or control circuits, which are generally identified in FIG. 4E at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with mass data storage 464 that stores data in a nonvolatile manner such as optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". Cellular phone 450 may be connected to memory 466 such as RAM, ROM, low latency nonvolatile memory such as flash memory and/or other suitable electronic data storage. Cellular phone 450 also may support connections with a WLAN via a WLAN network interface 468.

Figure 4F:
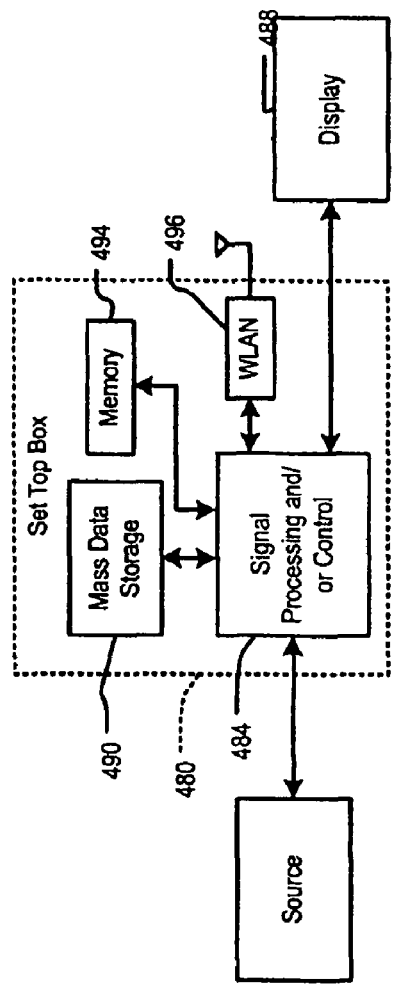

Referring now to FIG. 4F, the present invention may be embodied in a set top box 480. The present invention may implement either or both signal processing and/or control circuits, which are generally identified in FIG. 4F at 484, a WLAN interface and/or mass data storage of the set top box 480. Set top box 480 receives signals from a source such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". Set top box 480 may be connected to memory 494 such as RAM, ROM, low latency nonvolatile memory such as flash memory and/or other suitable electronic data storage. Set top box 480 also may support connections with a WLAN via a WLAN network interface 496.

Figure 4G:
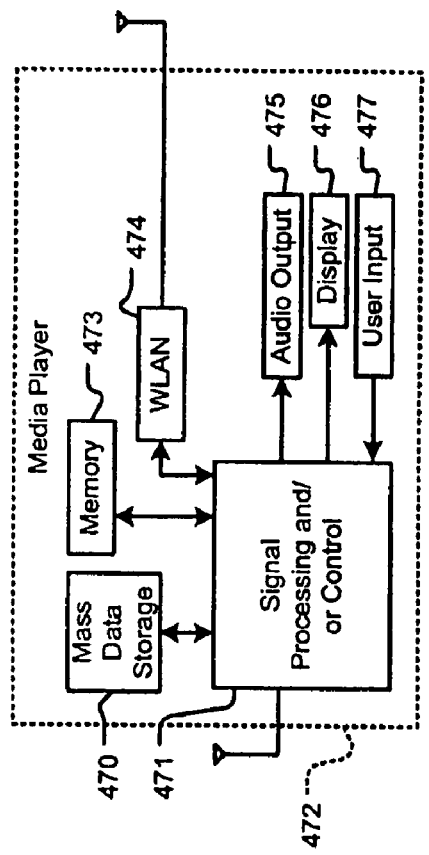

Referring now to FIG. 4G, the present invention may be embodied in a media player 472. The present invention may implement either or both signal processing and/or control circuits, which are generally identified in FIG. 4G at 471, a WLAN interface and/or mass data storage of the media player 472. In some implementations, media player 472 includes a display 476 and/or a user input 477 such as a keypad, touchpad and the like. In some implementations, media player 472 may employ a graphical user interface (GUI) that typically employs menus, drop down menus, icons and/or a point-and-click interface via display 476 and/or user input 477. Media player 472 further includes an audio output 475 such as a speaker and/or audio output jack. Signal processing and/or control circuits 471 and/or other circuits (not shown) of media player 472 may process data, perform coding and/or encryption, perform calculations, format data and/or perform any other media player function.

Media player 472 may communicate with mass data storage 470 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". Media player 472 may be connected to memory 473 such as RAM, ROM, low latency nonvolatile memory such as flash memory and/or other suitable electronic data storage. Media player 472 also may support connections with a WLAN via a WLAN network interface 474.

Figure 4H:
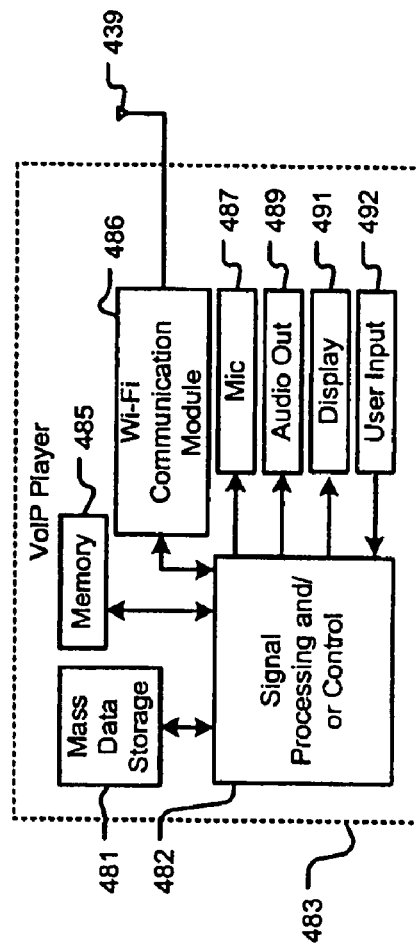

Referring to FIG. 4H, the present invention may be embodied in a Voice over Internet Protocol (VoIP) phone 483 that may include an antenna 439. The present invention may implement either or both signal processing and/or control circuits, which are generally identified in FIG. 4H at 482, a wireless interface and/or mass data storage of the VoIP phone 483. In some implementations, VoIP phone 483 includes, in part, a microphone 487, an audio output 489 such as a speaker and/or audio output jack, a display monitor 491, an input device 492 such as a keypad, pointing device, voice actuation and/or other input devices, and a Wireless Fidelity (Wi-Fi) communication module 486. Signal processing and/or control circuits 482 and/or other circuits (not shown) in VoIP phone 483 may process data, perform coding and/or encryption, perform calculations, format data and/or perform other VoIP phone functions.

VoIP phone 483 may communicate with mass data storage 502 that stores data in a nonvolatile manner such as optical and/or magnetic storage devices, for example hard disk drives HDD and/or DVDs. At least one HDD may have the configuration shown in FIG. 4A and/or at least one DVD may have the configuration shown in FIG. 4B. The HDD may be a mini HDD that includes one or more platters having a diameter that is smaller than approximately 1.8". VoIP phone 483 may be connected to memory 485, which may be a RAM, ROM, low latency nonvolatile memory such as flash memory and/or other suitable electronic data storage. VoIP phone 483 is configured to establish communications link with a VoIP network (not shown) via Wi-Fi communication module 486. Still other implementations in addition to those described above are contemplated.

It is to be understood that the exemplary embodiments described above are for illustrative purposes only and that various modifications or changes in light thereof will be suggested to persons skilled in the art and are to be included within the spirit and purview of this application and scope of the appended claims. For example, while exemplary embodiment 200 is described and shown as including a phased-locked loop circuit, it is to be understood that other embodiments may use a frequency locked-loop, delay locked loop, or any other closed-loop control circuitry adapted to track and filter the phase or frequency of the dithered clock train. Therefore, the above description should not be understood as limiting the scope of the invention as defined by the claims.

The invention claimed is:

1. A digital circuit comprising:
  a variable divider configured to divide a frequency of a clock train by a temporally-varying divider value to generate a dithered clock train;
  first logic in communication with the variable divider, the first logic configured to modify the dithered clock train to generate a frequency modulation waveform;
  second logic in communication with the first logic, the second logic configured to generate a phase modulation signal based on the frequency modulation waveform; and
  a phase-value calculator in communication with the second logic, the phase-value calculator configured to calculate the temporally-varying divider value based on the phase modulation signal.

2. The digital circuit of claim 1, wherein the temporally-varying divider value comprises a fixed-divider value plus a phase value.

3. The digital circuit of claim 2, wherein the phase value is determined from the frequency modulation waveform.

4. The digital circuit of claim 2, wherein the phase value is proportional to a deviation of the frequency modulation waveform from the center of the frequency modulation waveform.

5. The digital circuit of claim 2, wherein the phase-value calculator comprises:
  first and second circuit paths configured to transfer the phase modulation signal to a first adder; and wherein:
    the second circuit path comprises a phase-shift circuit configured to temporally modify the phase modulation signal in the second circuit path relative to the phase modulation signal in the first circuit path; and
    the first adder is configured to generate the phase value by calculating a difference between the phase modulation signal in the first circuit path and the modified phase modulation signal in the second circuit path.

6. The digital circuit of claim 1, wherein the frequency modulation waveform is periodic or quasi-periodic.

7. The digital circuit of claim 1, wherein the frequency modulation waveform comprises a triangle waveform.

8. The digital circuit of claim 1, further comprising a control circuit in communication with the variable divider, the control circuit configured to generate a spread-spectrum clock train based on the dithered clock train.

9. The digital circuit of claim 8, wherein the control circuit is configured to track and filter the dithered clock train to generate the spread-spectrum clock train.

10. The digital circuit of claim 8, wherein the control circuit is configured to multiply a frequency of the dithered clock train by a fixed-multiplier value.

11. The digital circuit of claim 10, wherein the temporally-varying divider value comprises a fixed-divider value plus a phase value, and an average frequency of the spread-spectrum clock train comprises a frequency of the clock train multiplied by the fixed-multiplier value and divided by the fixed-divider value.

12. The digital circuit of claim 8, wherein the control circuit comprises a phase-locked loop.

13. The digital circuit of claim 2, wherein the phase-value calculator comprises:
  first and second circuit paths configured to transfer the phase modulation signal to a first adder; and wherein:
    the second circuit path comprises a delay circuit configured to temporally delay the phase modulation signal in the second circuit path relative to the phase modulation signal in the first circuit path; and the first adder is configured to generate the phase value by calculating a difference between the phase modulation signal in the first circuit path and the delayed phase modulation signal in the second circuit path.

14. The digital circuit of claim 13, wherein the phase-value calculator further comprises a second adder configured to generate the temporally-varying divider value by adding the phase value to the fixed-divider value.

15. The digital circuit of claim 1, wherein:
the second logic is further in communication with the variable divider, and the second logic is further configured to generate the phase modulation signal based on the frequency modulation waveform and the dithered clock train; and
the phase-value calculator is further in communication with the variable divider, and the phase-value calculator is further configured to generate the temporally-varying divider value based on the phase modulation signal and the dithered clock train.

16. A method comprising:
generating a phase modulation signal based on a frequency modulation waveform;
generating a phase value based on the phase modulation signal;
dividing a frequency of a clock train by a divider value comprising a fixed value added to the phase value to generate a dithered clock train that is phase modulated by the phase value; and
modifying the dithered clock train to generate the frequency modulation waveform.

17. The method of claim 16, wherein the frequency modulation waveform is periodic or quasi-periodic.

18. The method of claim 16, wherein the frequency modulation waveform comprises a triangle waveform.

19. The method of claim 16, wherein the clock train comprises a digital clock train.

20. The method of claim 16, wherein the dithered clock train comprises a digital clock train.

21. The method of claim 16, wherein the phase value is proportional to a deviation of the frequency modulation waveform from a center of the frequency modulation waveform.

22. The method of claim 16, further comprising:
tracking and locking onto the dithered clock train; and
based on the tracking and locking steps, generating a spread-spectrum clock train that is a spread spectrum of the clock train.

23. The method of claim 16, further comprising multiplying a frequency of the dithered clock train by a multiplier value.

24. The method of claim 23, wherein an average frequency of a spread-spectrum clock train is a frequency of the clock train multiplied by the multiplier value divided by the fixed value.

25. The method of claim 16, further comprising:
splitting the phase modulation signal into a first phase modulation signal and a second phase modulation signal;
temporally delaying the second phase modulation signal with respect to the first phase modulation signal; and
generating the phase value based on a difference between the first phase modulation signal and the delayed second phase modulation signal.

26. The method of claim 25, further comprising adding the phase value to the fixed value to generate the divider value.

27. The method of claim 16, further comprising:
splitting the phase modulation signal into a first phase modulation signal and a second phase modulation signal;
temporally modifying the second phase modulation signal with respect to the first phase modulation signal; and
generating the phase value based on a difference between the first phase modulation signal and the modified second phase modulation signal.

28. A digital circuit comprising:
a variable divider configured to digitally modulate a width of clock pulses composing a clock train to generate a dithered clock train based on a temporally-varying divider value;
first logic configured to modify the dithered clock train to generate a frequency modulation waveform;
second logic configured to process the frequency modulation waveform to generate a phase modulation signal; and
a phase-value calculator configured to generate the temporally-varying divider value based on the phase modulation signal.

29. The digital circuit of claim 28, wherein the temporally-varying divider value comprises a fixed-divider value plus a phase value.

30. The digital circuit of claim 29, wherein the phase-value calculator is further configured to add the phase value to the fixed-divider value.

31. The digital circuit of claim 29, wherein the phase value is proportional to a deviation of the frequency modulation waveform from a center of the frequency modulation waveform.

32. The digital circuit of claim 29, wherein the phase-value calculator is further configured to generate the phase value by splitting the phase modulation signal into first and second phase modulation signals and temporally modify the second phase modulation signal with respect to the first modulation signal to calculate a difference between the first phase modulation signal and the modified second phase modulation signals.

33. The digital circuit of claim 29, wherein the phase-value calculator is further configured to generate the phase value based on the phase modulation signal.

34. The digital circuit of claim 29, wherein the phase-value calculator is further configured to generate the phase value by splitting the phase modulation signal into first and second phase modulation signals and delay the second phase modulation signal with respect to the first modulation signal to calculate a difference between the first phase modulation signal and the delayed second phase modulation signals.

35. The digital circuit of claim 28, wherein the frequency modulation waveform is periodic or quasi-periodic.

36. The digital circuit of claim 28, wherein the frequency modulation waveform comprises a triangle waveform.

37. The digital circuit of claim 28, further comprising a control circuit configured to track and filter the dithered clock train to generate a spread-spectrum clock train.

38. A digital circuit comprising:
a variable divider configured to divide a frequency of a clock train by a temporally-varying divider value to generate a dithered clock train;
first logic in communication with the variable divider, the first logic configured to modify the dithered clock train to generate a frequency modulation waveform;

second logic in communication with the first logic, the second logic configured to generate a phase modulation signal based on the frequency modulation waveform;

a phase-value calculator in communication with the second logic, the phase-value calculator configured to calculate the temporally-varying divider value based on the phase modulation signal;

wherein the temporally-varying divider value comprises a fixed-divider value plus a phase value; and wherein the phase-value calculator comprises:
a delay circuit configured to temporally delay the phase modulation signal; and
a first adder configured to generate the phase value by calculating a difference between the phase modulation signal and the delayed phase modulation signal.

* * * * *